United States Patent
Feng et al.

(10) Patent No.: US 7,627,835 B2
(45) Date of Patent: Dec. 1, 2009

(54) FREQUENCY DIVIDER MONITOR OF PHASE LOCK LOOP

(75) Inventors: Kai Di Feng, Hopewell Junction, NY (US); Zhenrong Jin, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 132 days.

(21) Appl. No.: 11/765,475

(22) Filed: Jun. 20, 2007

(65) Prior Publication Data

US 2007/0245271 A1 Oct. 18, 2007

Related U.S. Application Data

(63) Continuation-in-part of application No. 11/276,410, filed on Feb. 28, 2006, now Pat. No. 7,362,184.

(51) Int. Cl.
 *G06F 17/50* (2006.01)
(52) U.S. Cl. ............................... 716/1; 716/2
(58) Field of Classification Search ............... 716/1, 716/2, 18
 See application file for complete search history.

(56) References Cited

U.S. PATENT DOCUMENTS

| | | | |
|---|---|---|---|
| 5,119,043 A | 6/1992 | Borwn et al. | |
| 5,838,202 A | 11/1998 | Kosiec et al. | |
| 6,008,655 A | 12/1999 | Kuroda | |
| 6,671,863 B2 * | 12/2003 | Gauthier et al. | 716/6 |
| 6,704,908 B1 * | 3/2004 | Horan et al. | 716/1 |
| 6,859,028 B2 | 2/2005 | Tener | |
| 6,909,330 B2 * | 6/2005 | Colleran et al. | 331/8 |
| 6,920,622 B1 * | 7/2005 | Garlepp et al. | 716/6 |
| 7,362,184 B2 | 4/2008 | Feng et al. | |
| 2003/0113122 A1 | 6/2003 | Koga | |

OTHER PUBLICATIONS

Office Action (Mail Date Oct. 2, 2009) for U.S. Appl. No. 11/944,795, filed Nov. 26, 2007.

* cited by examiner

*Primary Examiner*—Jack Chiang
*Assistant Examiner*—Binh C Tat
(74) *Attorney, Agent, or Firm*—Schmeiser, Olsen & Watts; W. Riyon Harding

(57) ABSTRACT

A design structure for designing, manufacturing, and/or testing a frequency divider and monitoring circuit. The circuit including a phase locked loop circuit including a voltage controlled oscillator and a feedback frequency divider, an output of the voltage controlled oscillator connected to an input of the feedback frequency divider, and output of the feedback frequency divider coupled to an input of the voltage controlled oscillator; and a frequency divider monitor having a first input, a second input and an output, the first input of the frequency divider monitor connected to the output of the voltage controlled oscillator and the second input of the frequency divider monitor coupled to an output of the feedback frequency divider.

25 Claims, 12 Drawing Sheets

FREQUENCY DIVIDER MONITOR OF PHASE LOCK LOOP

CROSS-REFERENCE TO RELATED APPLICATION

This patent application is a continuation in part of U.S. patent application Ser. No. 11/276,410, filed Feb. 28, 2006 now U.S. Pat. No. 7,362,184, which is assigned to the present assignee.

FIELD OF THE INVENTION

The present invention relates to the field of frequency divider circuits; more specifically, it relates to a design structure comprising circuits for monitoring the operation frequency of the divider circuits.

BACKGROUND OF THE INVENTION

In modern integrated circuits and electronic systems, clock signals are generated using phase lock loop circuits that use frequency feedback to generate a clock signal with stable frequency value and constant phase performance. Frequency dividers are one of the most prone to failure components of the high speed phase lock loops. In one failure mode, the output frequency of the frequency divider changes from design or drifts. In such a case, the integrated circuit or electronic system to which the clock signal is supplied can malfunction. Therefore, there is a need for methods and circuits for monitoring operation of the frequency dividers of integrated circuits and electronic systems.

SUMMARY OF THE INVENTION

A first aspect of the present invention is a design structure for designing, manufacturing, and/or testing a circuit, the circuit comprising: a phase locked loop circuit including a voltage controlled oscillator and a feedback frequency divider, an output of the voltage controlled oscillator connected to an input of the feedback frequency divider, an output of the feedback frequency divider coupled to an input of the voltage controlled oscillator; and a frequency divider monitor having a first input, a second input and an output, the first input of the frequency divider monitor connected to the output of the voltage controlled oscillator and the second input of the frequency divider monitor coupled to an output of the feedback frequency divider.

A second aspect of the present invention is a method, comprising: providing a phase locked loop circuit including a voltage controlled oscillator and a feedback frequency divider, an output of the voltage controlled oscillator connected to an input of the feedback frequency divider, an output of the feedback frequency divider coupled to an input of the phase detector; providing a frequency divider monitor having a first input, a second input and an output, the first input of the frequency divider monitor connected to the output of the voltage controlled oscillator and the second input of the frequency divider monitor coupled to an output of the feedback frequency divider; measuring a frequency ratio of a frequency of a signal on the output of the voltage controlled oscillator and of a frequency of a signal on the output of the feedback frequency divider; and generating a alert signal in response to the frequency ratio falling outside an upper or a lower limit around a specified value of the frequency ratio.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

An external frequency divider is defined as a frequency divider not physically present on the integrated circuit chip containing the phase lock loop, but it is a part of the feedback frequency divider.

A clock signal is defined as a signal having a regular repeating pattern of a time period of high voltage and a time period of low voltage. The duty cycle of a clock signal is the time duration of a high period divided by the time period of the clock signal. The voltage level of the low periods is often denoted as a "0" and the voltage level of the high periods is often denoted as "1." Hereinafter, the signals denoted as $f_{IN}$, $f_{VCOO}$, $f_B$, $f_{OUT}$ and $f_{EXT}$ are clock signals.

A frequency divider is a circuit that generates an output signal having a frequency that is less than the frequency of the input signal. The divide ratio of a frequency divider is defined as the frequency of the output signal divided by the frequency of the input signal and is never greater than 1. For example, a divide by 3 frequency divider has a output frequency that is ⅓ that of the input frequency. It is common for the divide ratio to be expressed as a ratio of positive whole numbers greater than zero.

The term identically designed is defined to mean devices (e.g. capacitors, transistors, diodes, resistors, current sources) or circuits that are intended to be as close to identical when fabricated as permitted by the fabrication process used to fabricate the devices or circuits.

Figure 1:
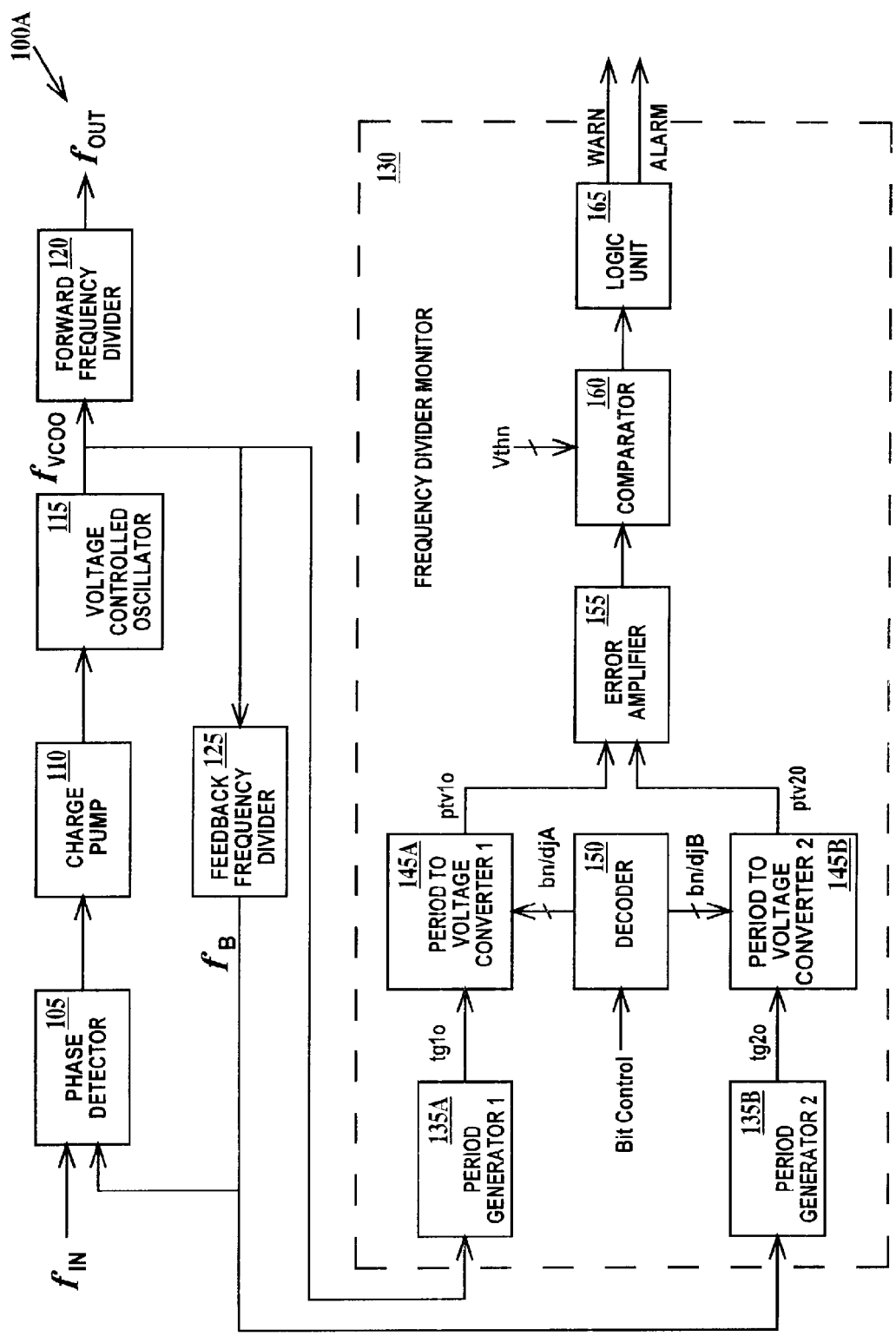
FIG. 1 is block circuit diagram of a first frequency generator and monitor circuit according to a first embodiment of the present invention.

FIG. 1 is the block circuit diagram of a first frequency generator and monitor circuit 100A according to a first embodiment of the present invention. In FIG. 1, frequency generator and monitor circuit 100A includes a phase locked loop circuit which includes a phase detector 105, a charge pump 110, a voltage controlled oscillator 115 which generates a clock signal $f_{VCOO}$, a forward frequency divider 120 (which is optional) which generates a clock signal $f_{OUT}$ and a feedback frequency divider 125 which generates a clock signal $f_B$.

A first input of phase detector 105 is connected to clock signal $f_{IN}$ and a second input of the phase detector is connected to an output ($f_B$) of feedback frequency divider 125. An output of phase detector 105 is connected to an input of charge pump 110. An output of charge pump 110 is connected to and input of voltage controlled oscillator 115. An output ($f_{VCOO}$) of voltage controlled oscillator 115 is connected to an input of forward frequency divider 120 and an input of feedback frequency divider 125.

Frequency generator and monitor circuit 100A also includes a frequency divider monitor 130. Frequency divider monitor 130 includes a first period generator 135A which generates a tg1o signal and a second period generator 135B which generates a tg2o signal, a first period to voltage converter 145A which generates a ptv1o from the tg1o signal and a plurality of bn/dj bit inputs and a second period to voltage converter 145B which generates a ptv2o from the tg2o signal and the plurality of bn/dj bit inputs, a decoder 150 which generate bd/djA and bd/djB bits from a bit control signal, an error amplifier 155, a comparator 160 having a plurality of threshold voltage inputs Vthn, and a logic unit 165 generating alert signals WARN and ALARM.

Alternatively, first and second period to voltage converters 145A and 145B may be designed for specific R ratios (see equation 1) and decoder 150 eliminated.

An input of first period generator 135A is connected to the output ($f_{VCOO}$) of voltage controlled oscillator 115. An input of second period generator 135B is connected to the output ($f_B$) of feedback frequency divider 125. An input of first period to voltage converter 145A is connected to the output (tg1o) of first period generator 135A. An input of second period to voltage converter 145B is connected to the output (tg2o) of second period generator 135B. First and second period generators 135A and 135B are identically designed. First and second period to voltage converters 145A and 145B are identically designed. Bits bn/djA and bn/djB are supplied to first and second period to voltage converters 145A and 145B respectively.

The operation of frequency divider monitor 130 is based on the fact that the ratio (R) of the frequency of the output signal ($f_{VCOO}$) of voltage controlled oscillator and the frequency of the output signal ($f_B$) of feedback frequency divider 125 is designed to be a constant and preset value as expressed by:

$$f_{VCOO}/f_B = R \quad (1)$$

Frequency divider monitor 130 measures $f_{VCOO}/f_B$ in real time and when $f_{VCOO}/f_B$ exceeds limits set on R (i.e. exceeds R+HL or R−LL where HL is the maximum increase in R allowed and LL is the maximum decrease in R allowed). A warning signal (WARN) or an alarm signal (ALARM) is generated when the limits on R are exceeded.

In FIG. 1, the value R includes only the divide ratio of feedback frequency divider 125. So the only frequency divider monitored by frequency divider monitor 130 is feedback frequency divider 125.

Figure 2:
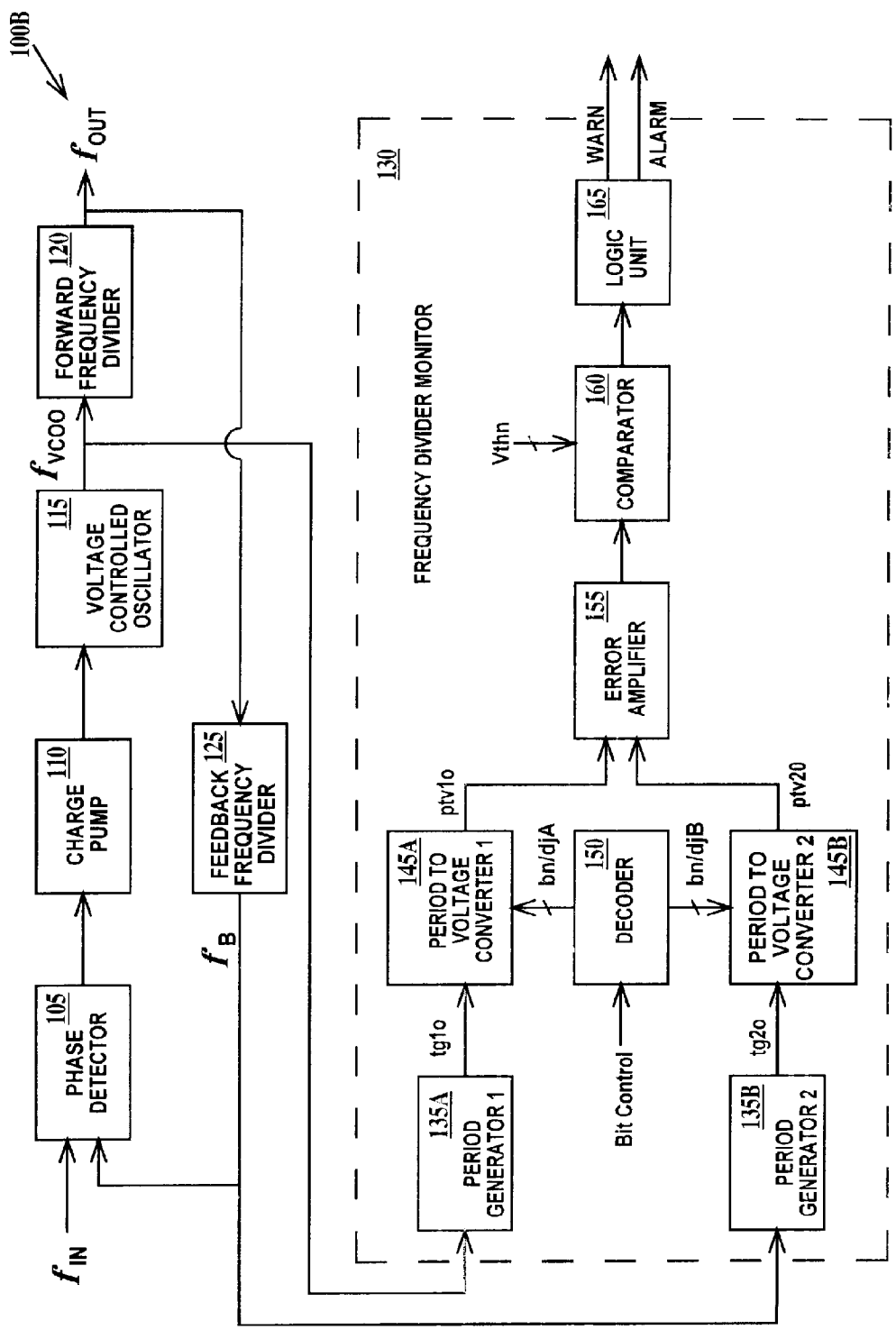
FIG. 2 is block circuit diagram of a second frequency generator and monitor circuit according to a second embodiment of the present invention.

FIG. 2 is block circuit diagram of a second frequency generator and monitor circuit 110B according to a second embodiment of the present invention. Frequency generator and monitor circuit 110B is similar to frequency generator and monitor circuit 110A (see FIG. 1) except the input of feedback frequency divider 125 is connected to the output of forward frequency divider 120 instead of the output of voltage controlled oscillator 115 (see FIG. 1).

Operation of frequency generator and monitor circuit 110B is similar to the operation of frequency generator and monitor circuit 110A (see FIG. 1), but because the output ($f_{VCOO}$) of forward frequency divider 120 is presented to the input of feedback frequency divider 125, the value R includes the divide ratio of forward frequency divider 120 and the divide ratio of feedback frequency divider 125. So both forward frequency divider 120 and feedback frequency divider 125 are monitored by frequency divider monitor 130.

Figure 3:
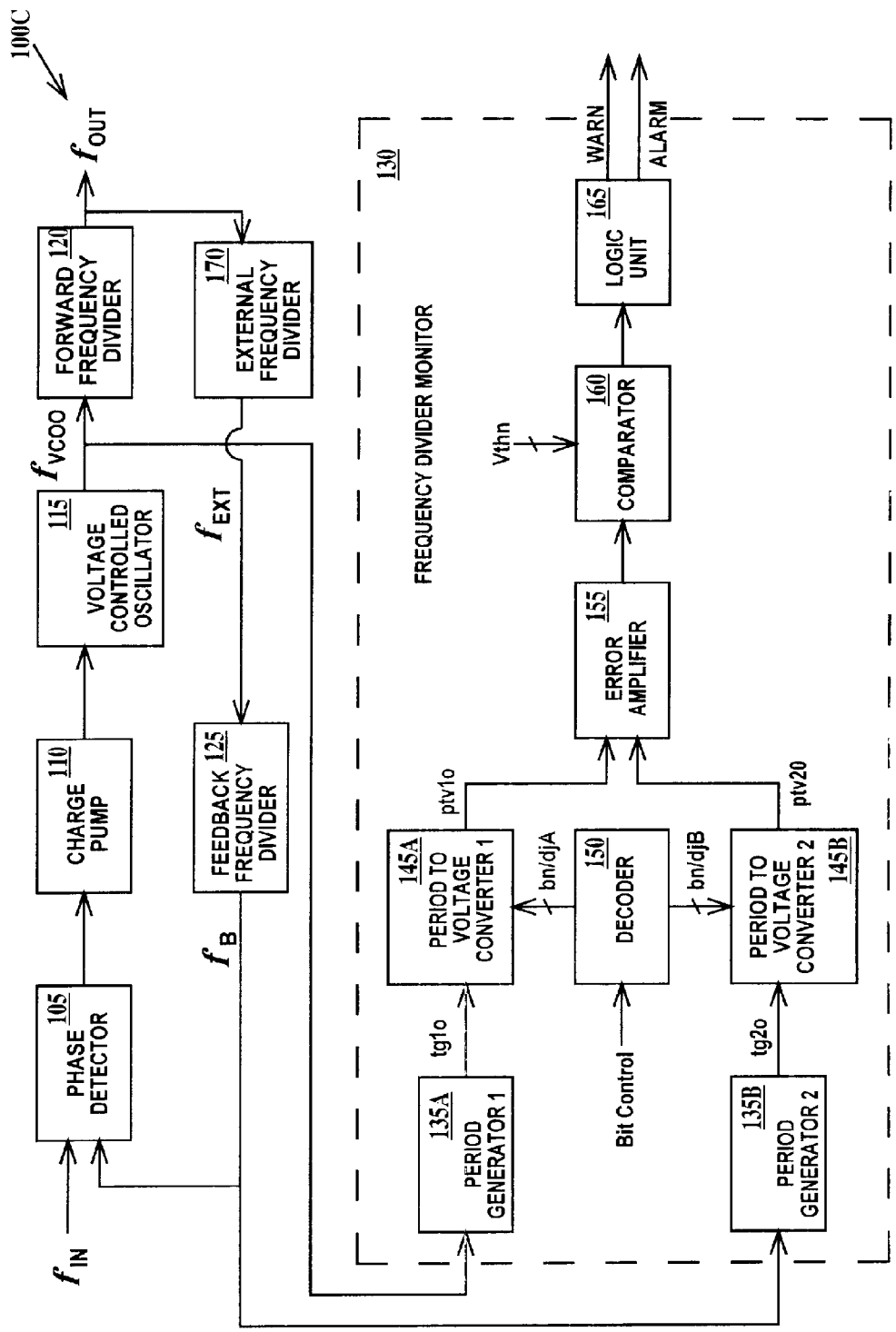
FIG. 3 is block circuit diagram of a third frequency generator and monitor circuit according to a third embodiment of the present invention.

FIG. 3 is block circuit diagram of a third frequency generator and monitor circuit 110C according to a third embodiment of the present invention. Frequency generator and monitor circuit 110C is similar to frequency generator and monitor circuit 110B (see FIG. 2) except the input of feedback frequency divider 125 is connected to the output of external frequency divider 170 instead of to the output of forward frequency divider 120 (see FIG. 2) and the input of external frequency divider 170 is connected to the output of forward frequency divider 120.

Operation of frequency generator and monitor circuit 110B is similar to the operation of frequency generator and monitor circuit 110B (see FIG. 2), but because the output ($f_{VCOO}$) of forward frequency divider 120 is presented to the input of forward frequency divider 120, the output ($f_{OUT}$) of forward frequency 120 is presented to the input of external frequency divider 170 and the output ($f_{EXT}$) of external frequency divider 170 is presented to the input of feedback frequency divider 125, the value R includes the divide ratio of forward frequency divider 120, the divide ratio of feedback frequency divider 125 and the divide ratio of external frequency divider 170. So forward frequency divider 120, feedback frequency divider 125 and external frequency divider 170 are monitored by frequency divider monitor 130.

Referring to FIGS. 1, 2 and 3, first and second period generators 135A and 135B are one bit counters so that the half period of the generator output is the period of the input regardless the duty cycle of the input. The counter can be rising edge trigged or falling edge trigged. This is illustrated in FIG. 4.

Figure 4:
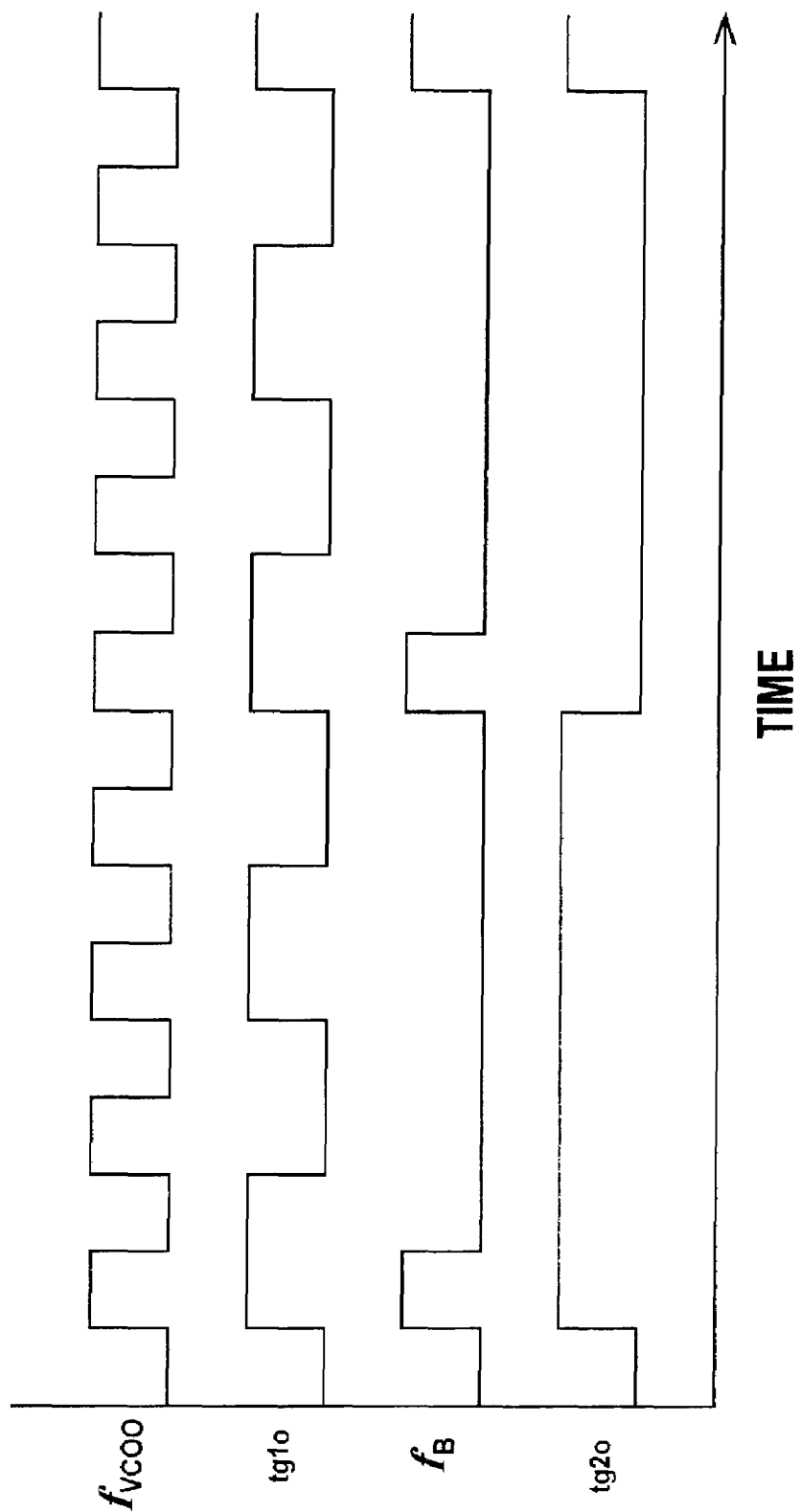
FIG. 4 is a timing diagram of various signals of the circuits of FIGS. 1, 2 and 3.

FIG. 4 is a timing diagram of various signals of the circuits of FIGS. 1, 2 and 3. In FIG. 4, the input ($f_{VCOO}$) to first period generator 135A (see FIG. 1) has an exemplary duty cycle of 50% and the half period of the output (tg1o) of first period generator 135A is equal to a period of $f_{VCOO}$. The input ($f_B$) to second period generator 135B (see FIG. 1) has an exemplary duty cycle of 12.5% and the half period of the output (tg2o) of second period generator 135A is equal to a period of $f_B$. In FIG. 4, feedback frequency generator 125 (see FIG. 3) is an exemplary divide by four (has divide ratio of 1/4) frequency divider. The period of tg2o is four times the period of tg1o. In general, since frequency dividers can only divide down the input frequency (a divide by 1 or divide by less than 1 frequency divider, by definition can not exist), $f_{VCOO}$ is equal to or higher than $f_B$ and the period of $f_{VCOO}$ is always equal to or shorter than that of $f_B$.

Figure 5:
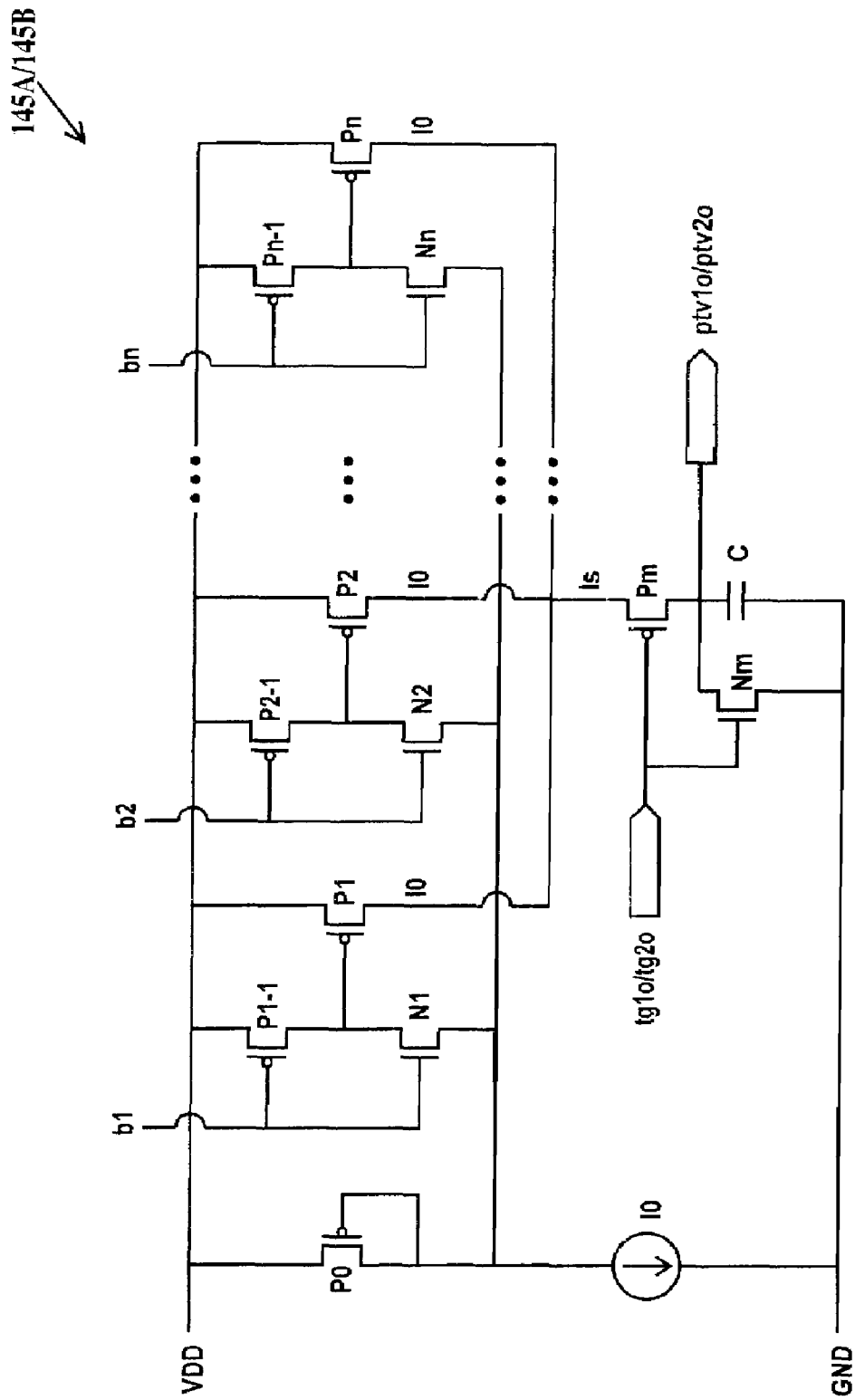
FIG. 5 is a circuit diagram of a first type of programmable period to voltage converter of FIGS. 1, 2 and 3.

FIG. 5 is a circuit diagram of a first type of programmable period to voltage converter of FIGS. 1, 2 and 3. In FIG. 5, programmable period to voltage converter 145A/145B includes a current mirror having a primary side and a secondary side including a set of programmable current fingers. Current source I0 and PFET P0 form the primary side of the current mirror. PFETs P1 to Pn, P1-1 to Pn-1 and NFETs N1 to Nn form the programmable current fingers of the secondary side of the current mirror. Each programmable current finger is identically designed. Each programmable current finger is connected to a corresponding control bit b1 to bn. When a control bit bk (k=1, 2, ... n) is at logic high, PFET Pk-1 is turned off, NFET Nk is turned on and the PFET Pk is turned on and has contribution of current I0 to the total current of Is. When tg1*o*/tg2*o* is at logic low, PFET Pm is turned on, NFET Nm is turned off, capacitor C (includes the parasitic capacitance on the ptv1*o*/ptv2*o*) is charged through PFET Pm by the current Is. The maximum voltage across capacitor C, VCmax, is given by:

$$VCmax = \frac{I0 * Nif * T}{C} \quad (2)$$

where I0 is the current level supplied by current source I0, Nif is the number of the programmable current fingers turned on, T is the period time of logic low of tg1*o*/tg2*o* and C is the total capacitance on ptv1*o*/ptv2*o*. When tg1*o*/tg2*o* is at logic high, PFET Pm is turned off and NFET Nm is turned on, capacitor C is discharged. Since the discharge current of capacitor C is much larger than the charge current I0 so the voltage level on ptv1*o*/ptv2*o* drops to zero very fast.

Returning to FIGS. 1, 2 and 3, the frequency ratio R, see equation (1) supra, and the period ratio is 1/R. R programmable current fingers are turned on in programmable period to voltage converter 145A while one programmable current finger is turned on in programmable period to voltage converter 145B. More generally, $$\frac{1}{R} = \frac{NifB}{NifA} \quad (3)$$

where NifA is the number of the programmable current fingers turned on in programmable period to voltage converter 145A and NifB is the number of the programmable current fingers turned on in programmable period to voltage converter 145B. The VCmax of each of programmable period to voltage converters 145A and 145B is the same.

Figure 6:
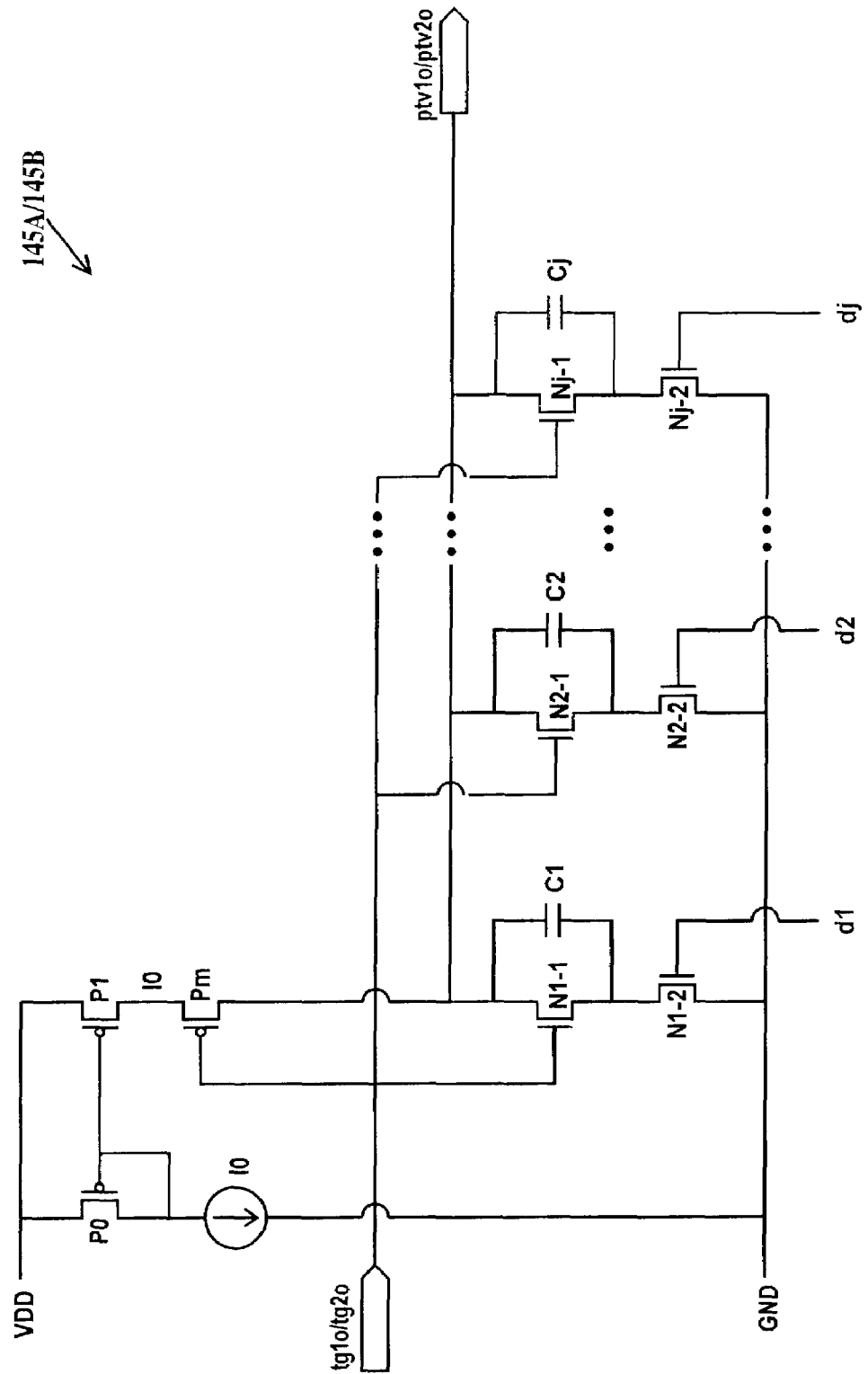
FIG. 6 is a circuit diagram of a second type of programmable period to voltage converter of FIGS. 1, 2 and 3.

FIG. 6 is a circuit diagram of a second type of programmable period to voltage converter of FIGS. 1, 2 and 3. In FIG. 6, programmable period to voltage converter 145A/45B includes a current mirror having a primary side and a secondary side including a set of programmable capacitor fingers. Current source I0 and PFET P0 form the primary side of the current mirror. PFET P1 is the secondary side of the current mirror. NFETs N1-1 to Nj-1, NFETs N1-2 to Nj-2 and capacitors C1 to Cj form the programmable capacitor fingers. Each programmable capacitor finger is identically designed. Each programmable capacitor finger is connected to a corresponding control bit d1 to dj. When the control bit dk(k=1, 2, j) is at logic high, the finger is selected, when dk is at logic low, the finger is disabled. When tg1*o*/tg2*o* is at logic low, PFET Pm is turned on, NFET Nk-1 is turned off and capacitor Ck is charged through PFET Pm by the current I0. The maximum voltage VCmax across the capacitors of all turned on programmable capacitor fingers is given by:

$$VCmax = \frac{I0 * T}{C * Ncf} \quad (4)$$

where I0 is the current level supplied by current source I0, T is the period time of logic low of tg1*o*/tg2*o*, C is the capacitance value the capacitor of each finger and Ncf is the number of programmable capacitor fingers turned on. When tg1*o*/tg2*o* is at logic high, PFET Pm is turned off and NFET Nk-1 (k=1, 2, ... j) is turned on, the capacitor Ck is discharged. Since the discharge current of C*Ncf is much larger than the charge current I0, the voltage level on ptv1*o*/ptv2*o* drops to zero very fast.

Returning to FIGS. 1, 2 and 3, the frequency ratio R, see equation (1) supra, and the period ratio is 1/R. R programmable capacitor fingers are turned on in programmable period to voltage converter 145B while one programmable capacitor finger is turned on in programmable period to voltage converter 145A. More generally, $$\frac{1}{R} = \frac{NcfA}{NcfB} \quad (5)$$

where NcfA is the number of the programmable capacitor fingers turned on in programmable period to voltage converter 145A and NcfB is the number of the programmable capacitor fingers turned on in programmable period to voltage converter 145B. The VCmax of each of programmable period to voltage converters 145A and 145B is the same.

Figure 7:
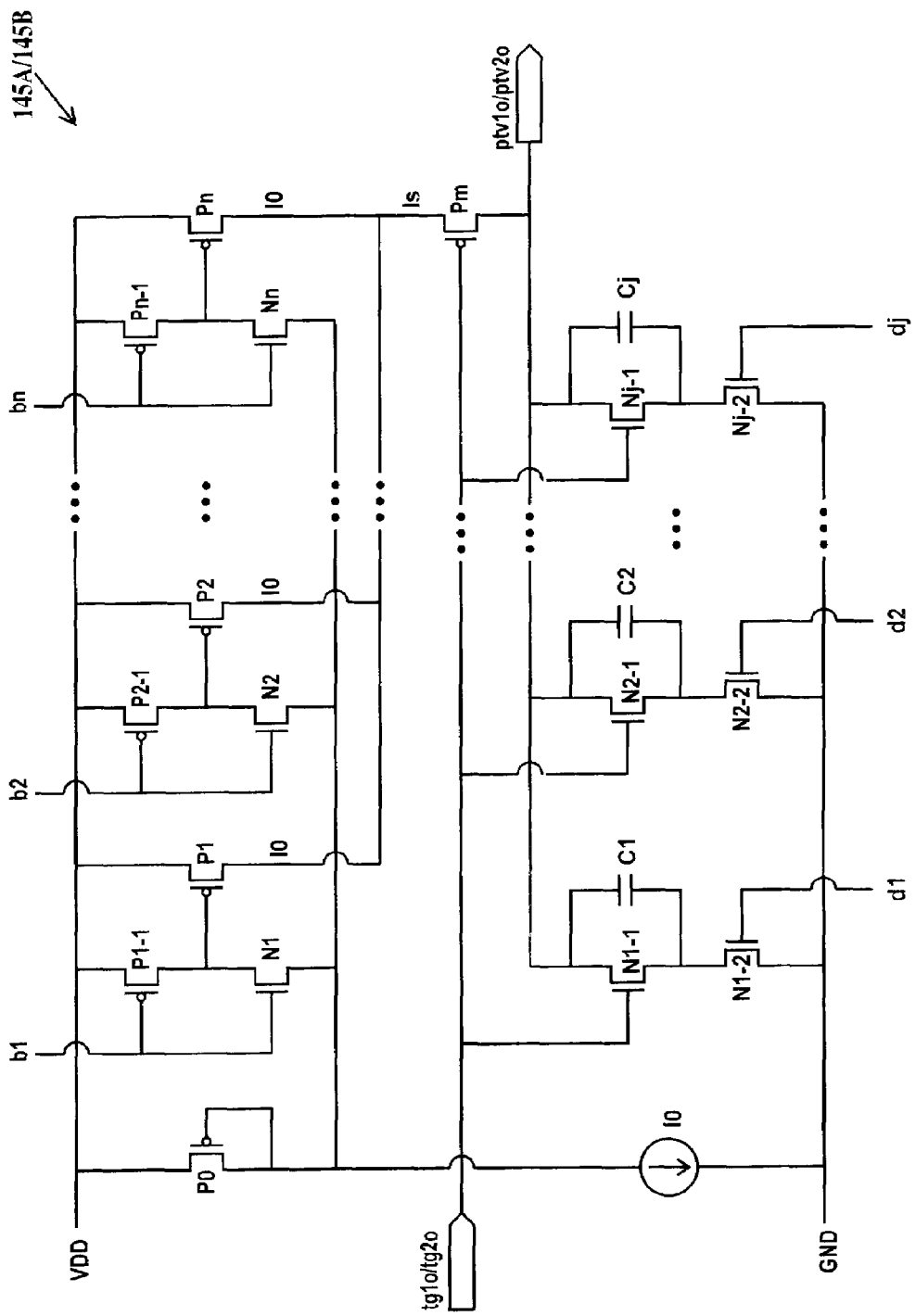
FIG. 7 is a circuit diagram of a third type of programmable period to voltage converter of FIGS. 1, 2 and 3.

FIG. 7 is a circuit diagram of a third type of programmable period to voltage converter of FIGS. 1, 2 and 3. Programmable period to voltage converter 145A/145B of FIG. 7 is a combination of programmable period to voltage converters 145A/145B of FIG. 5 and of FIG. 6 and operates similarly. In FIG. 7, programmable period to voltage converter 145A/145B includes a current mirror having a primary side and a secondary side. The secondary side has a first section including a set of programmable current fingers and a second section including a set of programmable capacitor fingers. Current source I0 and PFET P0 form the primary side of the current mirror. PFETs P1 to Pn, P1-1 to Pn-1. NFETs N1 to Nn form the programmable current fingers of the first section of the secondary side of the current mirror. Each programmable current finger of the first section is identically designed. Each programmable current finger of the first section is connected to a corresponding control bit b1 to bn. NFETs N1-1 to Nj-1, NFETs N1-2 to Nj-2 and capacitors C1 to Cj form the programmable capacitor fingers of the second section of the secondary side of the current mirror. Each programmable capacitor finger of the second section is identically designed. Each programmable capacitor finger of the second section is connected to a corresponding control bit d1 to dj. The maximum voltage VCmax across the capacitors of all turned on programmable capacitor fingers is given by:

$$VC\max = \frac{I0 * Nif * T}{C * Ncf} \quad (6)$$

where I0 is the current level supplied by current source I0, Nif is the number of the programmable current fingers turned on, T is the period time of logic low of tg1o/tg2o, C is the capacitance value a capacitor of a programmable capacitor finger and Ncf is the number of programmable capacitor fingers turned on.

Returning to FIGS. 1, 2 and 3, the frequency ratio R, see equation (1) supra, and the period ratio is 1/R. R programmable fingers are turned on in programmable period to voltage converter 145A while one current finger is turned on in programmable period to voltage converter 145B. More generally, $$R = \frac{NcfB}{NcfA} * \frac{NifA}{NifB} \quad (7)$$

where NcfA is the number of the programmable capacitor fingers turned on in programmable period to voltage converter 145A, NcfB is the number of the programmable capacitor fingers turned on in programmable period to voltage converter 145B, NifA is the number of the programmable current fingers turned on in programmable period to voltage converter 145A and NcfB is the number of the programmable current fingers turned on in programmable period to voltage converter 145B. The VCmax of each of programmable period to voltage converters 145A and 145B is the same.

Decoder 150 (see FIG. 1) is a logic circuit that sets the bit values b1 through bn (0 or 1) and d1 through dj (0 or 1) using a Bit Control signal based on the frequency divider ratios of each frequency divider in the clock paths, feedback frequency divider 125 in FIG. 1, forward frequency divider 120 and feedback frequency divider 125 in FIG. 2 and forward frequency divider 120, feedback frequency divider 125 and external frequency divider 170 in FIG. 3.

Figure 8:
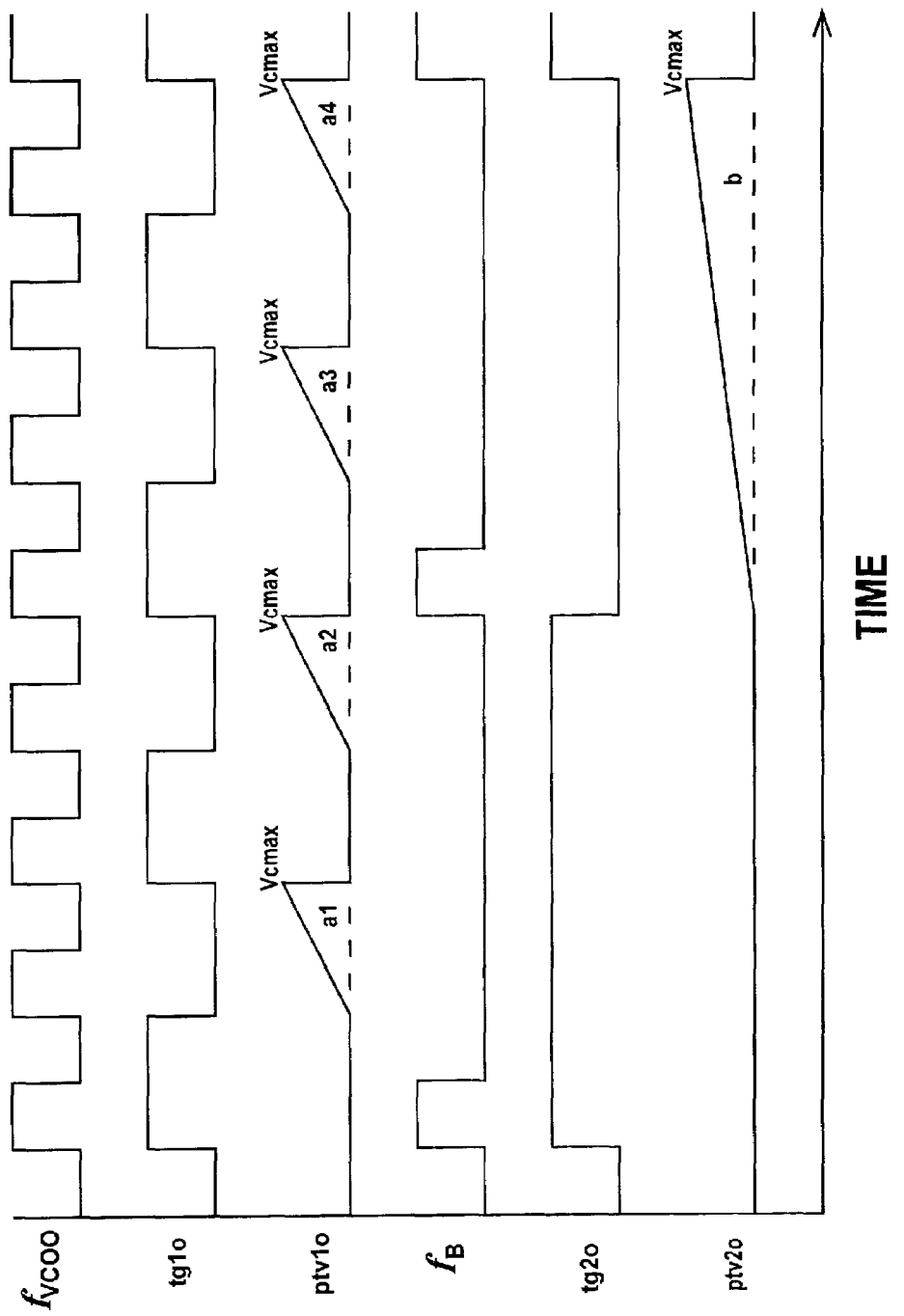
FIG. 8 is a additional timing diagram of various signals of the circuits of FIGS. 1, 2 and 3.

FIG. 8 is an additional timing diagram of various signals of the circuits of FIGS. 1, 2 and 3. In FIG. 8 waveforms for ptv1o and ptv2o have been added to those previously shown in FIG. 4 and described supra. When equation (3) or (5) or (7) (depending on the type of programmable period to voltage converter used) is met, the maximum voltage of ptv1o is equal to the maximum voltage of ptv2o and the average voltage of ptv1o is equal to the average voltage of ptv2o the same period of time. For example, in FIG. 8, the areas a1+a2+a3+a4 equal the area b. However, when equation (3) or (5) or (7) is not met, then VCmax of ptv1o and ptv2o is not the same, the areas a1+a2+a3+a4 are not equal to area b, and a probable malfunction of a frequency divider has occurred.

The function of error amplifier 155 (see FIG. 1) is to magnify the voltage difference of signals ptv1o and ptv2o described supra. There are two types of amplifiers that may be used for error amplifier 155, a peak voltage operational amplifier illustrated in FIG. 9 and an average voltage operational amplifier illustrated in FIG. 10.

Figure 9:
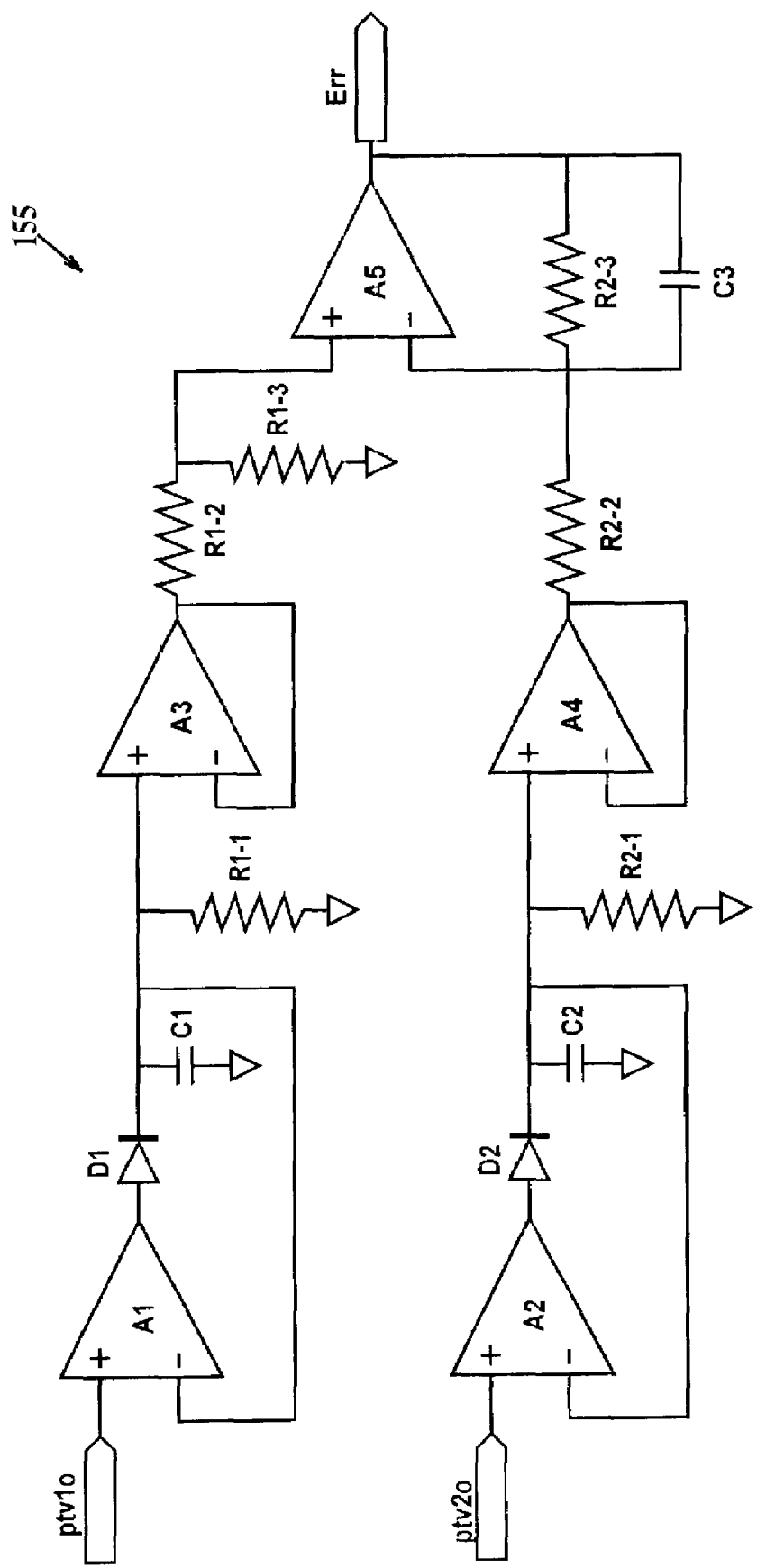
FIG. 9 is a circuit diagram a first type of error amplifier circuit of FIGS. 1, 2 and 3.

FIG. 9 is a circuit diagram a first type of error amplifier circuit of FIGS. 1, 2 and 3. In FIG. 9, an exemplary error amplifier 155 includes operational amplifiers A1, A2, A3, A4 and A5, diodes D1 and D2, capacitors C1, C2 and C3 and resistors R1-1, R1-2, R1-3, R2-1, R2-2 and R2-3. Operational amplifier A1, diode D1 and capacitor C1 form a first peak detector for ptv1o. Operational amplifier A2, diode D2 and capacitor C2 form a second peak detector for ptv2o. Amplifiers A3 and A4 are high input impedance voltage followers. Resistors R1-1 and R2-1 are leakage resistors which provide a small leakage from the capacitors C1 and C2 respectively so that the outputs of the peak detectors are a little bit lower than the peak voltages (quasi peak) and work to dynamically update the peak voltages detected. Resistor R1-1 and R2-1 can be resistors with large resistance or small sink-current current sources. The operational amplifier A5, and resistors R1-2, R1-3, R2-2 and R2-3 form a difference amplifier whose output (ERR) is the difference of the two peak voltages detected. Capacitor C3 is used to filter out the voltage ripple of the quasi detectors.

Figure 10:
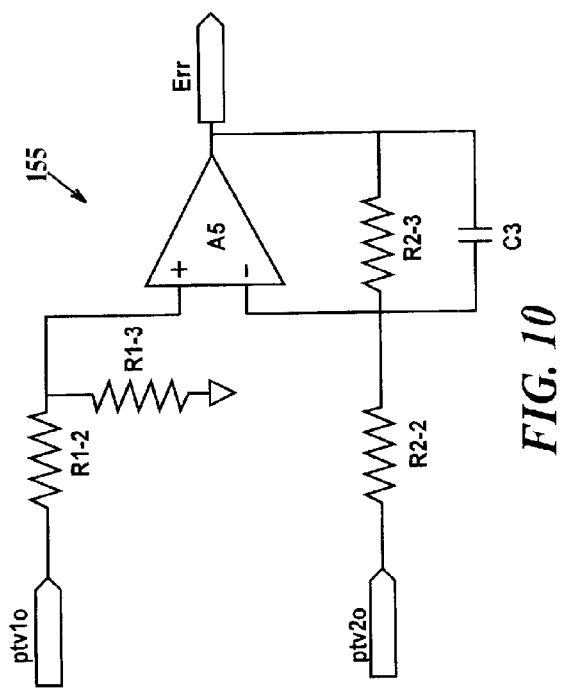
FIG. 10 is a circuit diagram of a second type of error amplifier circuit of FIGS. 1, 2 and 3.

FIG. 10 is a circuit diagram of a second type of error amplifier circuit of FIGS. 1, 2 and 3. In FIG. 10, an exemplary error amplifier 155 includes operational amplifier A5, capacitor C3 and resistors R1-2, R1-3, R2-2 and R2-3. The operational amplifier A5 with large capacitance C3 has much lower forward operating frequency (positive input of A5 to ERR) than a feedback frequency (ERR to the negative input of A5) so that the output (ERR) of operational amplifier A5 is proportional to the average of the voltage difference between ptv1o and ptv2o.

Figure 11:
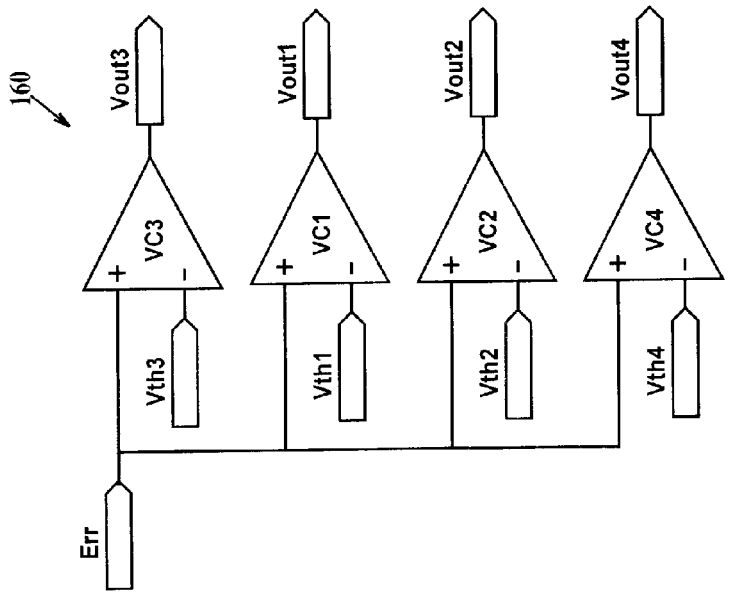
FIG. 11 is a circuit diagram a comparator of FIGS. 1, 2 and 3.

FIG. 11 is a circuit diagram the comparator 160 of FIGS. 1, 2 and 3. In FIG. 11, comparator 160 includes four voltage comparators VC1, VC2, VC3 and VC4 having corresponding negative inputs Vth1, Vth2, Vth3 and Vth4 for settable threshold voltages having the relationship Vth3>Vth1>Vth2>Vth4, and corresponding outputs Vout1, Vout2, Vout 3 and Vout 4. ERR is connected to the positive inputs of each of voltage comparators VC1, VC2, VC3 and VC4.

Figure 12:
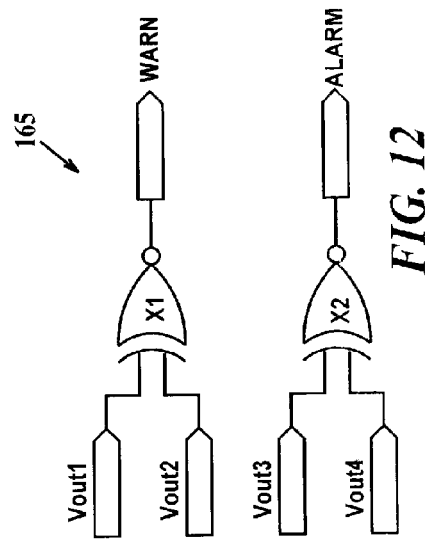
FIG. 12 is a circuit diagram a logic unit of FIGS. 1, 2 and 3.

FIG. 12 is a circuit diagram logic unit 165 of FIGS. 1, 2 and 3. In FIG. 12, logic unit comprises XNOR gate X1 and XNOR gate X2. The inputs to XNOR gate X1 are Vout1 and Vout2. The inputs to XNOR gate X2 are Vout3 and Vout3. The output of XNOR gate X1 is warning signal WARN. The output of XNOR gate X2 is alarm signal ALARM. When Vout1 and Vout2 are the same logic level, WARN goes high. When Vout3 and Vout4 are the same logic level, ALARM goes high.

The threshold voltages Vth1, Vth 2, Vth3 and Vth4 are selected to provide the following function when comparator 160 is connected to logic circuit 165.

(1) When ERR is lower than Vth1 and higher than Vth2, it is normal.
(2) When ERR is higher than Vth1 or lower than Vth2, a pre warning signal is sent out.
(3) When ERR is higher than Vth3 or lower than Vth4, a alarm signal is sent out. This is detailed in Truth Table I:

| ERR | Vout1 | Vout2 | Vout3 | Vout4 | WARN | ALARM |
|---|---|---|---|---|---|---|
| Vth2 < ERR < Vth1 | 0 | 1 | 0 | 1 | 0 | 0 |
| Vth1 < ERR | 1 | 1 | 0 | 1 | 1 | 0 |
| ERR < Vth2 | 0 | 0 | 0 | 1 | 1 | 0 |
| Vth3 < ERR | 1 | 1 | 1 | 1 | 1 | 1 |
| ERR < Vth4 | 0 | 0 | 0 | 0 | 1 | 1 |

Referring to FIG. 1, a variation of the first embodiment of the present invention may be used to monitor the duty cycle of feedback frequency divider 125. If the duty cycle of feedback frequency divider 125 is to be monitored, period generators 135A and 135B are omitted and the output ($f_{VCOO}$) of voltage controlled oscillator 115 is connected to the input of first period to voltage converter 145A and the output ($f_B$) of feedback frequency divider 125 is connected to the input of second period to voltage converter 145B. The operation of now modified frequency generator and monitor circuit 100A is similar to that of unmodified frequency generator and monitor circuit 100A.

Figure 13:
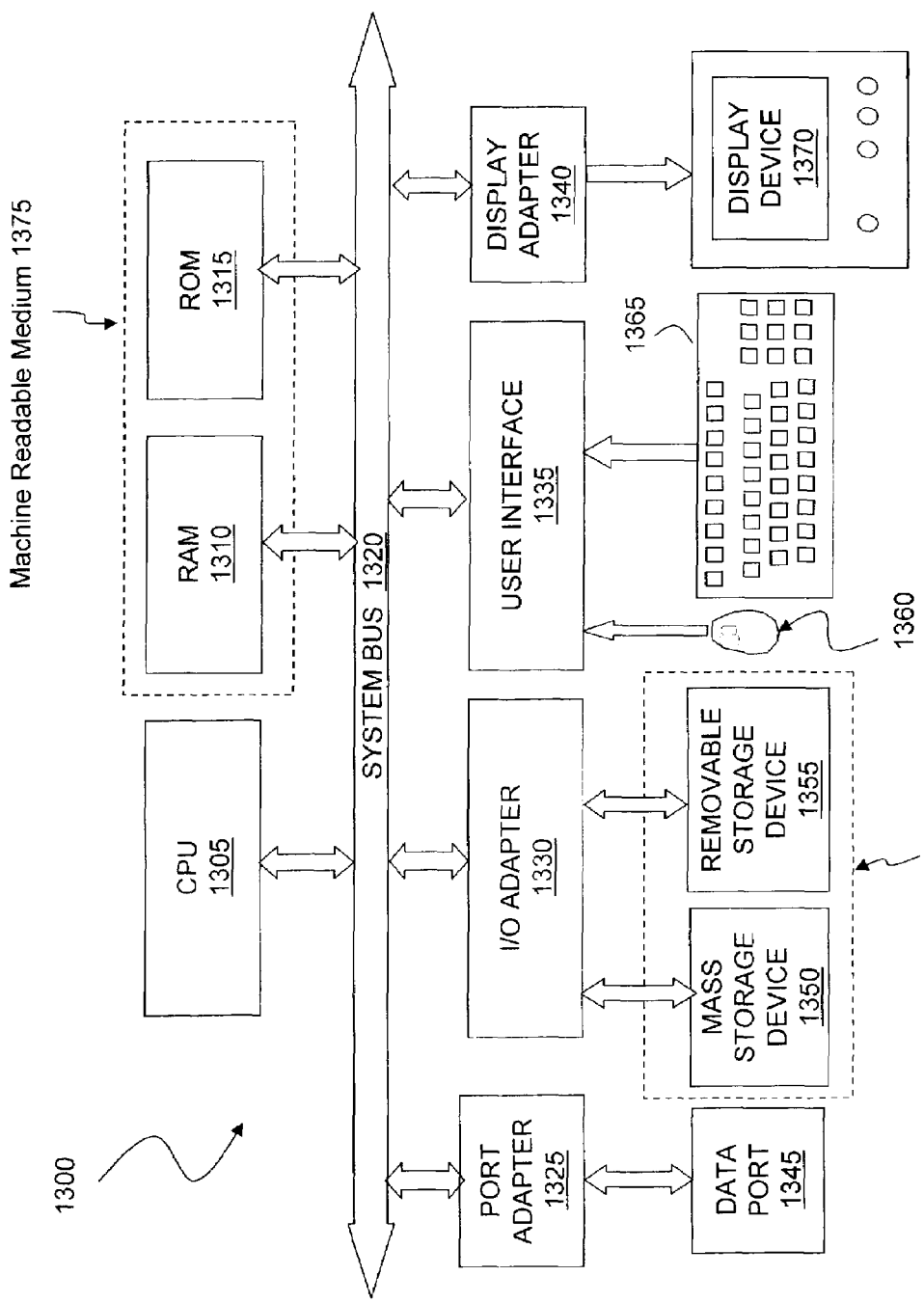
FIG. 13 illustrates a block diagram of a general-purpose computer system which can be used to implement the circuit and circuit design structure described herein.

FIG. 13 illustrates a block diagram of a general-purpose computer system which can be used to implement the circuit and circuit design structure described herein. The design structure may be coded as a set of instructions on removable or hard media for use by general-purpose computer. FIG. 13 is a schematic block diagram of a general-purpose computer for practicing the present invention. FIG. 13 shows a computer system 1300, which has at least one microprocessor or central processing unit (CPU) 1305. CPU 1305 is interconnected via a system bus 1320 to machine readable media 1375, which includes, for example, a random access memory (RAM) 1310, a read-only memory (ROM) 1315, a removable and/or program storage device 1355 and a mass data and/or program storage device 1350. An input/output (I/O) adapter 1330 connects mass storage device 1350 and removable storage device 1355 to system bus 1320. A user interface 1335 connects a keyboard 1365 and a mouse 1360 to system bus 1320, and a port adapter 1325 connects a data port 1345 to system bus 1320 and a display adapter 1340 connect a display device 1370. ROM 1315 contains the basic operating system for computer system 1300. Examples of removable data and/or program storage device 1355 include magnetic media such as floppy drives, tape drives, portable flash drives, zip drives, and optical media such as CD ROM or DVD drives. Examples of mass data and/or program storage device 1350 include hard disk drives and non-volatile memory such as flash memory. In addition to keyboard 1365 and mouse 1360, other user input devices such as trackballs, writing tablets, pressure pads, microphones, light pens and position-sensing screen displays may be connected to user interface 1335. Examples of display device 1370 include cathode-ray tubes (CRT) and liquid crystal displays (LCD).

A machine readable computer program may be created by one of skill in the art and stored in computer system 1300 or a data and/or any one or more of machine readable medium 1375 to simplify the practicing of this invention. In operation, information for the computer program created to run the present invention is loaded on the appropriate removable data and/or program storage device 1355, fed through data port 1345 or entered using keyboard 1365. A user controls the program by manipulating functions performed by the computer program and providing other data inputs via any of the above mentioned data input means. Display device 1370 provides a means for the user to accurately control the computer program and perform the desired tasks described herein.

Figure 14:
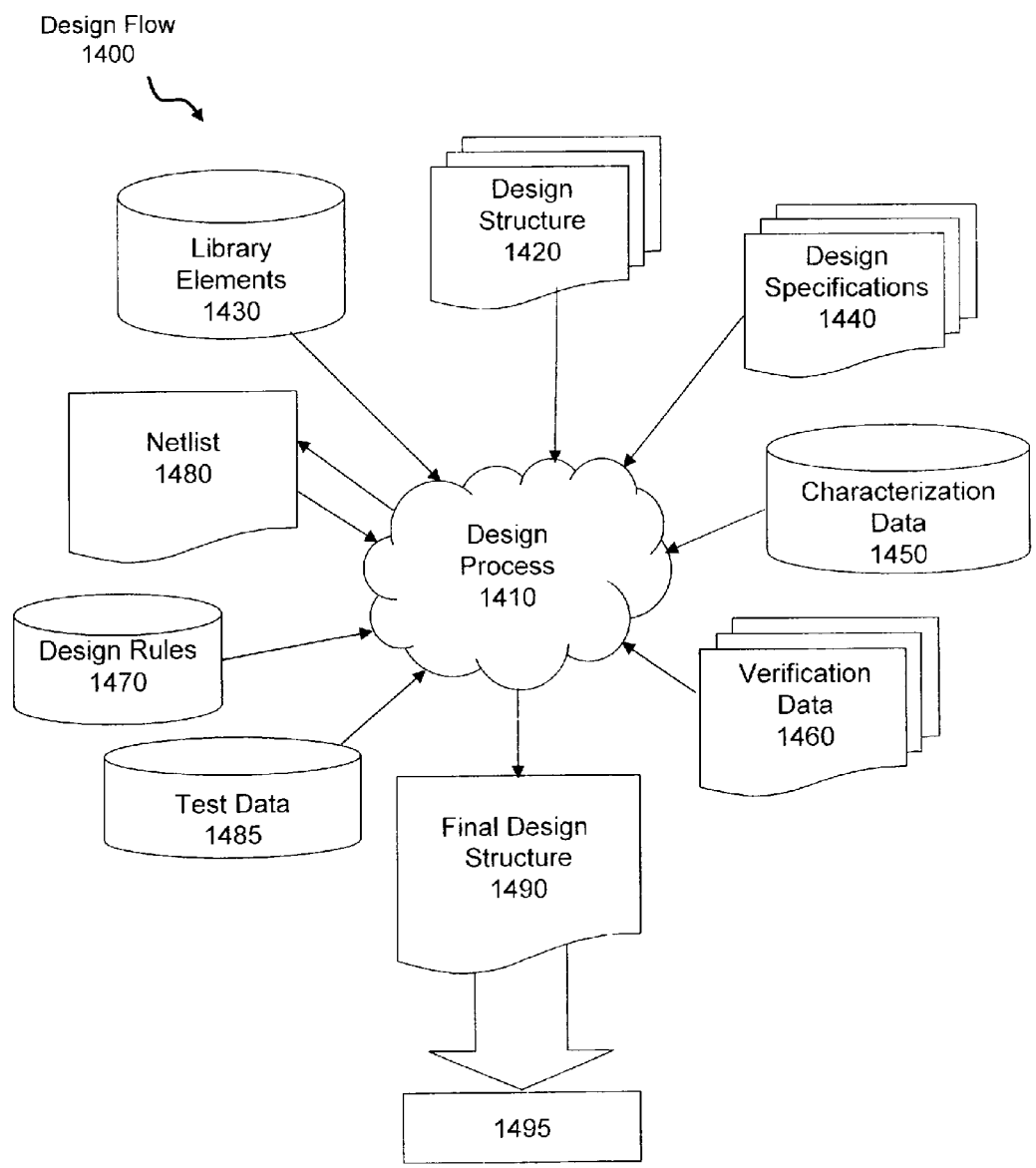
FIG. 14 shows a block diagram of an example design flow process for designing the circuit design structure described herein.

FIG. 14 shows a block diagram of an example design flow 1400. Design flow 1400 may vary depending on the type of IC being designed. For example, a design flow 1400 for building an application specific IC (ASIC) will differ from a design flow 1400 for designing a standard component. Design structure 1420 is an input to a design process 1410 and may come from an IP provider, a core developer, or other design company. Design structure 1420 comprises at least one of circuits 100 in the form of schematics or HDL, a hardware-description language, (e.g., Verilog, VHDL, C, etc.). Design structure 1420 may be on one or more of machine readable medium 1375 as shown in FIG. 13. For example, design structure 1420 may be a text file or a graphical representation of circuit 100A. Design process 1410 synthesizes (or translates) at least one of circuits 100 into a netlist 1480, where netlist 1480 is, for example, a list of fat wires, transistors, logic gates, control circuits, I/O, models, etc. and describes the connections to other elements and circuits in an integrated circuit design and recorded on at least one of machine readable medium 1375.

Design process 1410 includes using a variety of inputs; for example, inputs from library elements 1430 which may house a set of commonly used elements, circuits, and devices, including models, layouts, and symbolic representations, for a given manufacturing technology (e.g. different technology nodes, 32 nm, 45 nm, 90 nm, etc.), design specifications 1440, characterization data 1450, verification data 1460, design rules 1470, and test data files 1485, which may include test patterns and other testing information. Design process 1410 further includes, for example, standard circuit design processes such as timing analysis, verification tools, design rule checkers, place and route tools, etc. One of ordinary skill in the art of integrated circuit design can appreciate the extent of possible electronic design automation tools and applications used in design process 1410 without deviating from the scope and spirit of the invention.

Ultimately design process 1410 translates at least one of circuits 100, along with the rest of the integrated circuit design (if applicable), into a final design structure 1490 (e.g., information stored in a GDS storage medium). Final design structure 1490 may comprise information such as, for example, test data files, design content files, manufacturing data, layout parameters, wires, levels of metal, vias, shapes, test data, data for routing through the manufacturing line, and any other data required by a semiconductor manufacturer to produce at least one of circuits 100. Final design structure 1490 may then proceed to a stage 1495 of design flow 1400; where stage 1495 is, for example, where final design structure 1490: proceeds to tape-out, is released to manufacturing, is sent to another design house or is sent back to the customer.

Thus, the embodiments of the present invention provide design structures comprising circuits for monitoring operation of the frequency dividers integrated circuits and electronic systems.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A design structure embodied in a machine readable medium used in a design process, the design structure comprising:

a phase locked loop circuit including a voltage controlled oscillator and a feedback frequency divider, an output of said voltage controlled oscillator coupled to an input of said feedback frequency divider, an output of said feedback frequency divider coupled to an input of said voltage controlled oscillator; and a frequency divider monitor having a first input, a second input and an output, said first input of said frequency divider monitor directly connected to said output of said voltage controlled oscillator and said second input of said frequency divider monitor directly connected to an output of said feedback frequency divider, wherein said frequency divider monitor including:

a first and a second period generator, each said period generator having an input and an output, said input of said first period generator is said first input of said frequency divider monitor and said input of said second period generator is said second input of said frequency divider monitor;

a first and a second period to voltage converter, each period to voltage converter having an input and an output, said input of said first period to voltage converter connected to said output of said first period generator and said input of said second period to voltage converter connected to said output of said second period generator;

an error amplifier having a first input, a second input and an output, said output of said first period to voltage converter connected to said first input of said error amplifier and said output of said second period to voltage converter connected to said second input of said error amplifier; and a comparator having an input and an output and a plurality of threshold voltage inputs, said output of said error amplifier connected to said input of said comparator.

2. The design structure of claim 1, wherein said first and second period generators are one-bit counters.

3. The design structure of claim 1, wherein said first and second period to voltage converters each have a plurality of finger inputs and are identically designed current mirrors, a primary side of each current mirror comprising a current source and a secondary side of each current mirror comprising a plurality of fingers, corresponding fingers of said first and second current mirrors connected to a same corresponding and different finger input of said plurality of finger inputs.

4. The design structure of claim 1, wherein said first and second period to voltage converters are identically designed current mirrors, a primary side of each current mirror comprising a current source and a secondary side of each current mirror comprising a plurality of fingers, each finger including a capacitor, corresponding fingers of said first and second current mirrors connected to a same corresponding and different finger input of said plurality of finger inputs.

5. The design structure of claim 1, wherein said first and second period to voltage converters are identically designed current mirrors, a primary side of each current mirror comprising a current source and a secondary side, a first section of said secondary side of each current mirror comprising a first plurality of fingers, a second section of said secondary side of each current mirror comprising a second plurality of fingers, each finger of said second plurality of fingers including a capacitor, each finger of said first and second plurality of fingers connected to a corresponding and different finger input of said plurality of finger inputs.

6. The design structure of claim 1, wherein said error amplifier is a peak voltage difference amplifier or an average voltage difference amplifier.

7. The design structure of claim 1, further including:
a logic unit having an input and an output, said output of said comparator connected to said input of said logic unit, said output of said logic unit is said output of said frequency divider monitor.

8. The design structure of claim 1, wherein:
said output of said voltage controlled oscillator is directly connected to said input of said feedback frequency divider.

9. The design structure of claim 1, wherein said frequency divider monitor further includes a decoder, said decoder responsive to a signal indicating a designed ratio of a frequency of a signal on said output of said voltage controlled oscillator and of a frequency of a signal on said output of said feedback frequency oscillator, said decoder having a first set of outputs connected to programmable inputs said first period to voltage converter and a second set of outputs connected to programmable inputs said first period to voltage converter.

10. The design structure of claim 1, wherein the design structure comprises a netlist, which describes the circuit.

11. The design structure of claim 1, wherein the final design structure resides on a GDS storage medium.

12. The design structure of claim 1, wherein the design structure includes test data files, characterization data, verification data, or design specifications.

13. The design structure of claim 1, wherein:
said output of said voltage controlled oscillator is directly connected to an input of a forward frequency divider; and
said input of said feedback frequency is directly connected to an output of said forward frequency divider.

14. The design structure of claim 1, wherein:
said output of said voltage controlled oscillator is directly connected to an input of a forward frequency divider;
an output of said forward frequency divider is connected directly to an input of an external frequency divider; and
said input of said feedback frequency is directly connected to an output of said external frequency divider.

15. The design structure of claim 1, wherein:
said frequency divider monitor is configured to generate a signal on an output of said frequency divider monitor when a ratio of a signal on said output of said voltage controlled oscillator to a frequency of a signal on said output of said feedback frequency divider exceeds limits on a design value of a divide ratio of said feedback frequency divider.

16. A final design structure instantiated in a machine readable medium resulting from a design process for designing, manufacturing, or testing a circuit, the final design structure comprising:
a phase locked loop circuit including a voltage controlled oscillator and a feedback frequency divider, an output of said voltage controlled oscillator coupled to an input of said feedback frequency divider, an output of said feedback frequency divider coupled to an input of said voltage controlled oscillator; and
a frequency divider monitor having a first input, a second input and an output, said first input of said frequency divider monitor directly connected to said output of said voltage controlled oscillator and said second input of said frequency divider monitor directly connected to an output of said feedback frequency divider, wherein said frequency divider monitor including;
a first and a second period generator, each said period generator having an input and an output, said input of said first period generator is said first input of said frequency divider monitor and said input of said second period generator is said second input of said frequency divider monitor;
a first and a second period to voltage converter, each period to voltage converter having an input and an output, said input of said first period to voltage converter connected to said output of said first period generator and said input of said second period to voltage converter connected to said output of said second period generator;
an error amplifier having a first input, a second input and an output, said output of said first period to voltage converter connected to said first input of said error amplifier and said output of said second period to voltage converter connected to said second input of said error amplifier; and a comparator having an input and an output and a plurality of threshold voltage inputs, said output of said error amplifier connected to said input of said comparator.

17. The final design structure of claim 16, wherein said first and second period generators are one-bit counters.

18. The final design structure of claim 16, wherein said first and second period to voltage converters each have a plurality of finger inputs and are identically designed current mirrors, a primary side of each current mirror comprising a current source and a secondary side of each current mirror comprising a plurality of fingers, corresponding fingers of said first and second current mirrors connected to a same corresponding and different finger input of said plurality of finger inputs.

19. The final design structure of claim 16, wherein said first and second period to voltage converters are identically designed current mirrors, a primary side of each current mirror comprising a current source and a secondary side of each current mirror comprising a plurality of fingers, each finger including a capacitor, corresponding fingers of said first and second current mirrors connected to a same corresponding and different finger input of said plurality of finger inputs.

20. The final design structure of claim 16, wherein said first and second period to voltage converters are identically designed current mirrors, a primary side of each current mirror comprising a current source and a secondary side, a first section of said secondary side of each current mirror comprising a first plurality of fingers, a second section of said secondary side of each current mirror comprising a second plurality of fingers, each finger of said second plurality of fingers including a capacitor, each finger of said first and second plurality of fingers connected to a corresponding and different finger input of said plurality of finger inputs.

21. The final design structure of claim 16, wherein said error amplifier is a peak voltage difference amplifier or an average voltage difference amplifier.

22. The final design structure of claim 16, wherein:
said output of said voltage controlled oscillator is directly connected to said input of said feedback frequency divider.

23. The design structure of claim 16, wherein:
said output of said voltage controlled oscillator is directly connected to an input of a forward frequency divider; and
said input of said feedback frequency is directly connected to an output of said forward frequency divider.

24. The design structure of claim 16, wherein:
said output of said voltage controlled oscillator is directly connected to an input of a forward frequency divider;
an output of said forward frequency divider is connected directly to an input of an external frequency divider; and
said input of said feedback frequency is directly connected to an output of said external frequency divider.

25. The final design structure of claim 16, wherein:
said frequency divider monitor is configured to generate a signal on an output of said frequency divider monitor when a ratio of a signal on said output of said voltage controlled oscillator to a frequency of a signal on said output of said feedback frequency divider exceeds limits on a design value of a divide ratio of said feedback frequency divider.

* * * * *